(12) United States Patent
Park et al.

(10) Patent No.: US 8,227,704 B2
(45) Date of Patent: Jul. 24, 2012

(54) PRINTED CIRCUIT BOARD HAVING ELECTROMAGNETIC BANDGAP STRUCTURE

(75) Inventors: Dae-Hyun Park, Woolsan-si (KR); Han Kim, Yongin-si (KR); Kang-Wook Bong, Seoul (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 333 days.

(21) Appl. No.: 12/654,526

(22) Filed: Dec. 22, 2009

(65) Prior Publication Data

US 2011/0067917 A1 Mar. 24, 2011

(30) Foreign Application Priority Data

Sep. 18, 2009 (KR) .................. 10-2009-0088597

(51) Int. Cl.
*H05K 9/00* (2006.01)

(52) U.S. Cl. ........ 174/256; 174/262; 174/267; 361/748; 361/762; 361/766; 361/816; 361/818; 333/12; 333/22 R; 333/185; 343/700 MS; 343/909

(58) Field of Classification Search .......... 174/252–267, 174/359, 360, 376, 390, 392; 361/760–767, 361/780–785, 790–795, 748–752, 738, 118, 361/816, 818; 333/12, 22 R, 202–212, 236, 333/238, 245, 247, 167, 185, 175; 343/700 MS, 343/909; 438/612–618, 687, 780; 257/532, 257/666, 668, 686, 698, 697, 724, 786
See application file for complete search history.

(56) References Cited

U.S. PATENT DOCUMENTS

| | | | | |
|---|---|---|---|---|
| 5,600,483 A * | 2/1997 | Fan et al. | ...................... | 359/245 |
| 6,002,593 A * | 12/1999 | Tohya et al. | .................. | 361/765 |
| 6,091,310 A * | 7/2000 | Utsumi et al. | ................... | 333/12 |
| 6,198,362 B1 * | 3/2001 | Harada et al. | .................. | 333/12 |
| 6,215,372 B1 * | 4/2001 | Novak | ............. | 333/12 |
| 6,329,604 B1 * | 12/2001 | Koya | ............. | 174/255 |
| 6,353,540 B1 * | 3/2002 | Akiba et al. | .................. | 361/794 |
| 6,365,828 B1 * | 4/2002 | Kinoshita et al. | ............. | 174/359 |
| 6,476,771 B1 * | 11/2002 | McKinzie, III | ............. | 343/756 |
| 6,483,481 B1 * | 11/2002 | Sievenpiper et al. | ......... | 343/909 |
| 6,512,181 B2 * | 1/2003 | Okubo et al. | ................. | 174/255 |
| 6,670,932 B1 * | 12/2003 | Diaz et al. | .................... | 343/909 |
| 6,798,666 B1 * | 9/2004 | Alexander et al. | ............ | 361/766 |
| 6,833,512 B2 * | 12/2004 | Liu | ............. | 174/262 |
| 6,897,831 B2 * | 5/2005 | McKinzie et al. | ............ | 343/909 |
| 6,995,733 B2 * | 2/2006 | Waltho | ......... | 343/909 |
| 7,016,198 B2 * | 3/2006 | Fessler et al. | ................. | 361/780 |
| 7,026,995 B2 * | 4/2006 | Sreenivas et al. | ...... | 343/700 MS |
| 7,136,028 B2 * | 11/2006 | Ramprasad et al. | ......... | 343/909 |
| 7,136,029 B2 * | 11/2006 | Ramprasad et al. | ......... | 343/909 |
| 7,190,315 B2 * | 3/2007 | Waltho | ......... | 343/705 |

(Continued)

*Primary Examiner* — Michail V Datskovskiy (57) ABSTRACT

Disclosed is a printed circuit board including an electromagnetic bandgap structure. The electromagnetic bandgap structure, which includes a first dielectric material for interlayer insulation and is for blocking a noise, is inserted into the printed circuit board. The electromagnetic bandgap structure can include a first conductive plate, a second conductive plate arranged on a planar surface that is different from that of the first conductive plate, a third conductive plate arranged on a same planar surface as the first conductive plate, and a stitching via unit configured to connect the first conductive plate and the third conductive plate through the planar surface on which the second conductive plate is arranged. A second dielectric material having a permittivity that is different from that of the first dielectric material is interposed between any two of the first conductive plate, the second conductive plate, and the third conductive plate.

4 Claims, 9 Drawing Sheets

U.S. PATENT DOCUMENTS

| | | | |
|---|---|---|---|
| 7,215,007 B2 * | 5/2007 | McKinzie et al. | 257/664 |
| 7,215,301 B2 * | 5/2007 | Choi et al. | 343/909 |
| 7,253,788 B2 * | 8/2007 | Choi et al. | 343/909 |
| 7,423,608 B2 * | 9/2008 | Dunn et al. | 343/909 |
| 7,466,560 B2 * | 12/2008 | Hayashi et al. | 361/784 |
| 7,528,788 B2 * | 5/2009 | Dunn et al. | 343/795 |
| 7,586,444 B2 * | 9/2009 | Berlin et al. | 343/700 MS |
| 7,592,957 B2 * | 9/2009 | Achour et al. | 343/700 MS |
| 7,594,105 B2 * | 9/2009 | Ohsaka | 713/2 |
| 7,626,216 B2 * | 12/2009 | McKinzie, III | 257/192 |
| 7,675,729 B2 * | 3/2010 | Anthony et al. | 361/118 |
| 7,843,702 B2 * | 11/2010 | Choi et al. | 361/763 |
| 7,847,739 B2 * | 12/2010 | Achour et al. | 343/700 MS |
| 7,889,134 B2 * | 2/2011 | McKinzie et al. | 343/700 MS |
| 7,944,320 B2 * | 5/2011 | Han et al. | 333/12 |
| 8,004,369 B2 * | 8/2011 | Kwon et al. | 333/12 |
| 8,102,219 B2 * | 1/2012 | Koo et al. | 333/12 |
| 8,125,290 B2 * | 2/2012 | Wu et al. | 333/12 |
| 2005/0104678 A1 * | 5/2005 | Shahparnia et al. | 333/12 |
| 2005/0205292 A1 * | 9/2005 | Rogers et al. | 174/255 |
| 2006/0050010 A1 * | 3/2006 | Choi et al. | 343/909 |
| 2006/0050491 A1 * | 3/2006 | Hayashi et al. | 361/760 |
| 2006/0092093 A1 * | 5/2006 | Choi et al. | 343/909 |
| 2007/0001926 A1 * | 1/2007 | Waltho | 343/909 |
| 2007/0090398 A1 * | 4/2007 | McKinzie, III | 257/192 |
| 2007/0136618 A1 * | 6/2007 | Ohsaka | 713/323 |
| 2007/0228578 A1 * | 10/2007 | Chou | 257/774 |
| 2009/0011922 A1 * | 1/2009 | de Rochemont | 501/137 |
| 2009/0038840 A1 * | 2/2009 | Kim et al. | 174/376 |
| 2009/0039984 A1 * | 2/2009 | Kim et al. | 333/212 |
| 2009/0040741 A1 * | 2/2009 | Hayashi et al. | 361/794 |
| 2009/0071709 A1 * | 3/2009 | Han et al. | 174/260 |
| 2009/0080172 A1 * | 3/2009 | Arslan et al. | 361/816 |
| 2009/0135570 A1 * | 5/2009 | Chou et al. | 361/782 |
| 2009/0145646 A1 * | 6/2009 | Han et al. | 174/260 |
| 2009/0160578 A1 * | 6/2009 | Achour | 333/175 |
| 2009/0184782 A1 * | 7/2009 | Koo et al. | 333/204 |
| 2009/0236141 A1 * | 9/2009 | Kim et al. | 174/360 |
| 2009/0267704 A1 * | 10/2009 | Chang et al. | 333/175 |
| 2009/0278626 A1 * | 11/2009 | Lee | 333/185 |
| 2009/0315648 A1 * | 12/2009 | Toyao | 333/238 |
| 2009/0322450 A1 * | 12/2009 | Kim et al. | 333/204 |
| 2010/0108373 A1 * | 5/2010 | Park | 174/376 |

* cited by examiner

PRINTED CIRCUIT BOARD HAVING ELECTROMAGNETIC BANDGAP STRUCTURE

CROSS-REFERENCE TO RELATED PATENT APPLICATIONS

This application claims the benefit of Korean Patent Application No. 10-2009-0088597, filed on Sep. 18, 2009, in the Korean Intellectual Property Office, the disclosure of which is incorporated herein in their entirety by reference.

BACKGROUND OF THE INVENTION

1. Field of the Invention

The present invention relates to a substrate, more specifically to a noise reducing substrate capable of reducing a noise by using an EBG structure.

2. Background Art

As the operation frequencies of electronic products get higher, the electromagnetic interference (EMI) has been considered as one the chronic noise problems. Especially, the operation frequencies of the electronic products have recently been in a range of several tens MHz to several GHz, and thus it is significantly needed to solve the EMI problem. Specifically, since there has been little study on the solution to a noise generated at an edge of the substrate as the EMI problem of substrate, it is difficult to completely block the noises at the substrate.

Figure 1:
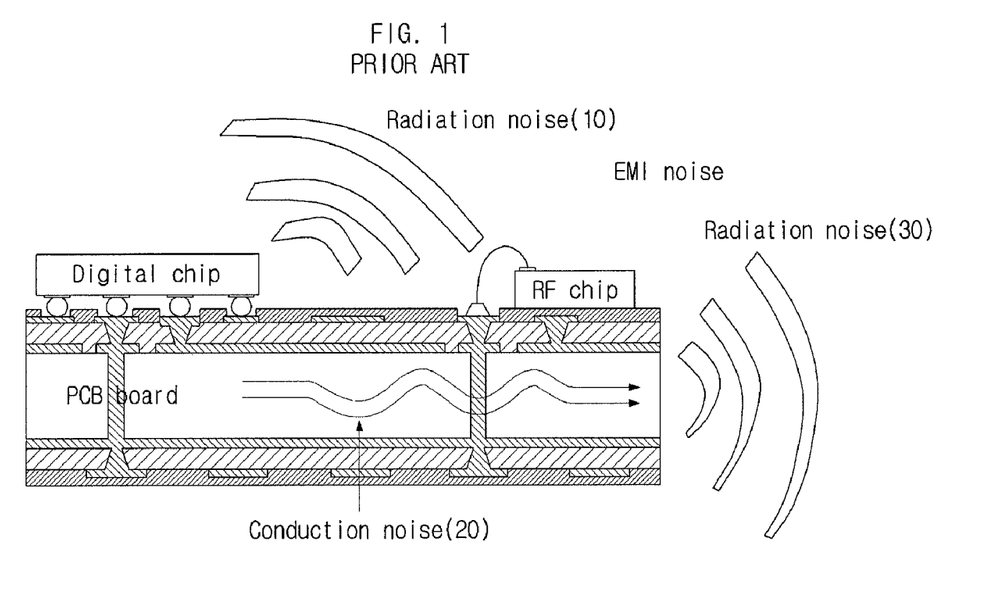
FIG. 1 shows how noises are transferred in a printed circuit board.

The noise problem is caused by an EMI noise, which is the interference between electromagnetic (EM) waves generated at any one of electronic circuits, devices, parts and/or the like and other EM waves generated at another one. As shown in FIG. 1, the EMI noise can be roughly classified into a radiation noise and a conduction noise.

The radiation noise transferred to an upper side (i.e., the mounting surface of an electronic part) of a substrate can be typically prevented by shielding the upper side of the substrate with an electromagnetic protective cap such as a metal cap. In contrast, it is not as easy to prevent the conduction noise. Furthermore, the operation frequencies of digital electronic products get higher causing the digital electronic products more complex, and thus it is difficult to find the solution.

SUMMARY

The present invention provides an EMI noise reducing printed circuit board capable of getting advantages in view of spatial configuration, manufacturing cost, and power consumption, by easily reducing noises having various frequency bands with a dielectric material.

An aspect of the present invention features a printed circuit board into which an electromagnetic bandgap structure including a first dielectric material for interlayer insulation and for blocking a noise is inserted. The electromagnetic bandgap structure can include: a first conductive plate; a second conductive plate arranged on a planar surface that is different from that of the first conductive plate; a third conductive plate arranged on a same planar surface as the first conductive plate; and a stitching via unit configured to connect the first conductive plate and the third conductive plate through the planar surface on which the second conductive plate is arranged. A second dielectric material having a permittivity that is different from that of the first dielectric material can be interposed between any two of the first conductive plate, the second conductive plate, and the third conductive plate.

The stitching via unit can include a connection pattern, which is arranged on the same planar surface as the second conductive plate and electrically separated from the second conductive plate, and a pair of vias connecting opposite ends of the connection pattern to the first conductive plate and the third conductive plate, respectively.

The second dielectric material can be interposed between the second conductive plate and the connection pattern.

The second dielectric material can have a higher permittivity than that of the first conductive plate.

DETAILED DESCRIPTION

Since there can be a variety of permutations and embodiments of the present invention, certain embodiments will be illustrated and described with reference to the accompanying drawings. This, however, is by no means to restrict the present invention to certain embodiments, and shall be construed as including all permutations, equivalents and substitutes covered by the spirit and scope of the present invention.

Throughout the description of the present invention, when describing a certain technology is determined to evade the point of the present invention, the pertinent detailed description will be omitted. Terms such as "first" and "second" can be used in describing various elements, but the above elements shall not be restricted to the above terms. The above terms are used only to distinguish one element from the other.

A printed circuit board in accordance with an embodiment of the present invention, as shown in FIG. 1, includes an electromagnetic bandgap structure to prevent an electromagnetic wave generated at any one of electronic circuits, devices and the like (e.g., digital chips) from being transferred to another one of electronic circuits, devices and the like (e.g., radio frequency (RF) chips). That is, such a noise is blocked by the electromagnetic bandgap structure included in the printed circuit board.

Before describing the printed circuit board including the electromagnetic bandgap structure of the present embodiment, the basic structure and principle of the printed circuit board of the present invention will be described with reference to FIG. 2.

Figure 2:
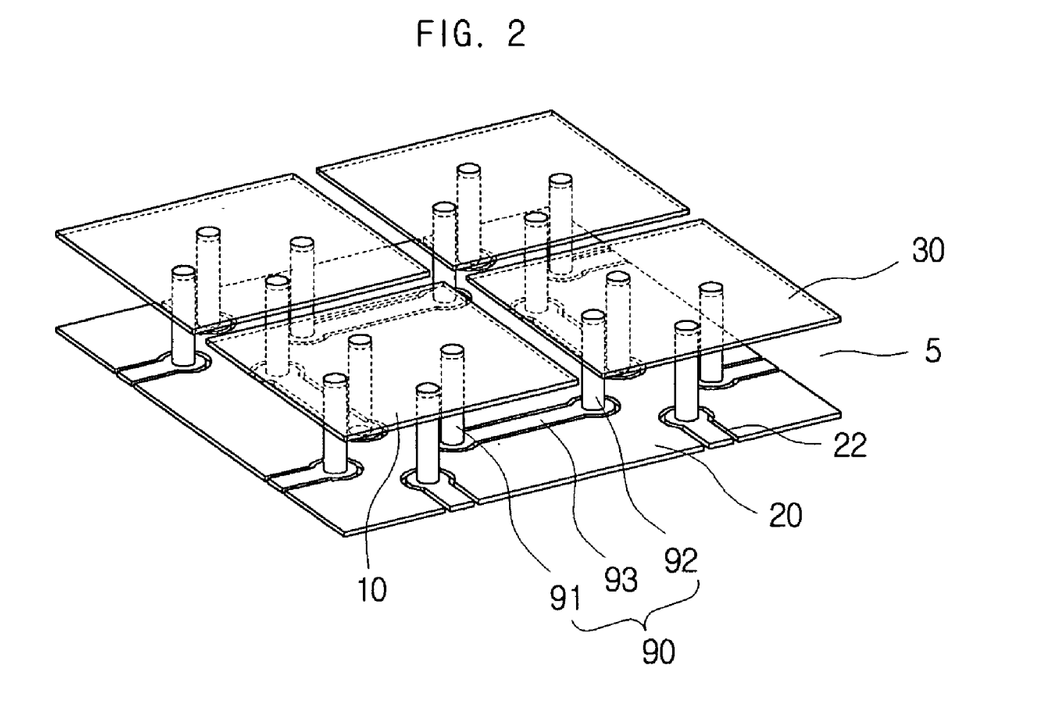
FIG. 2 is a perspective view showing a stitching via type of an electromagnetic bandgap structure.

FIG. 2 is a perspective view showing a stitching via type of an electromagnetic bandgap structure. As shown in FIG. 2, the stitching via type of an electromagnetic bandgap structure can include: a first conductive plate 10; a second conductive plate 20 arranged on a planar surface that is different from that of the first conductive plate 10; a third conductive plate 30 arranged on a same planar surface as the first conductive plate 10; and a stitching via unit 90 connecting the first conductive plate 10 to the third conductive plate 30 through the planar surface on which the second conductive plate 20 is arranged.

Here, the stitching via unit 90 is electrically separated from the second conductive plate 20 by a clearance hole 22 formed on the second conductive plate 20, and a dielectric material 5 is interposed between the first and third conductive plates 10 and 30 and the second conductive plate 20. All the aforementioned conductive plates may have a regular size and a certain shape. Alternatively, the conductive plates may have different sizes and different shapes as necessary in the design.

Figure 3:
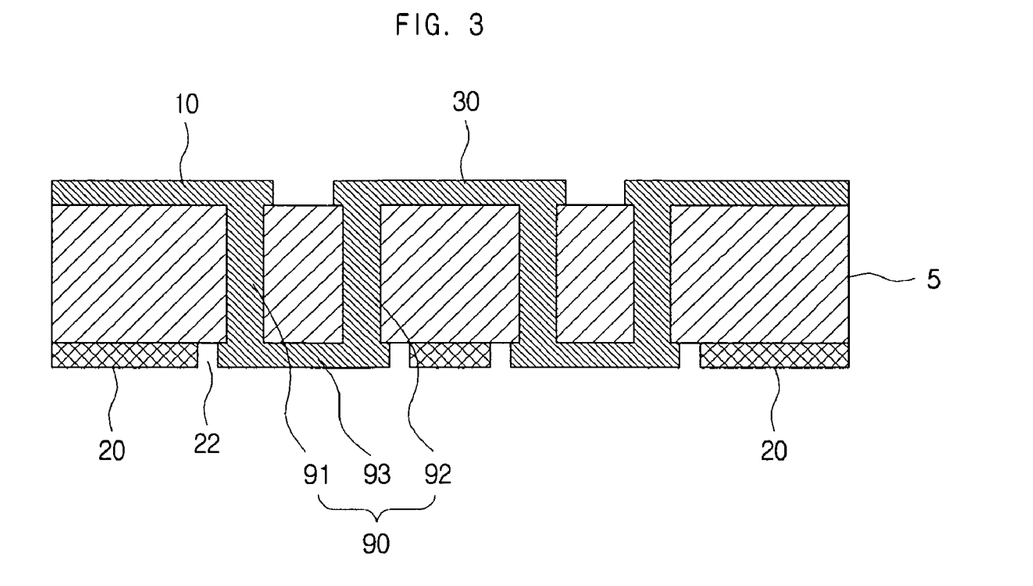
FIG. 3 is a cross sectional view showing a stitching via type of an electromagnetic bandgap structure.

As shown in FIGS. 2 and 3, the stitching via unit 90 can include a connection pattern 93 arranged on the same planar surface as the second conductive plate 20 and a pair of vias 91 and 92 connecting opposite ends of the connection pattern 93 to the first and third conductive plates 10 and 30.

Here, FIGS. 2 and 3 merely show elements constituting the electromagnetic bandgap structure (i.e., parts constituting the 2-layered electromagnetic bandgap structure including the stitching via unit) for the convenience of illustration. Accordingly, the first, second, the third conductive plates 10, 20, and 30 shown in FIGS. 2 and 3 may be any two metal layers of a multi-layered printed circuit board. In other words, it should be obvious that there can be additional metal layers below the second conductive plate 20 and above the first and third conductive plates 10 and 30.

For example, the electromagnetic bandgap structure shown in FIGS. 2 and 3 can be placed between any two metal layers functioning as a power layer and a ground layer, respectively, in a multi-layered printed circuit board in order to block a conductive noise. Since the conductive noise problem is not limited to the space between a power layer and a ground layer, the electromagnetic bandgap structure can be placed between any two ground layers or power layers placed on different layers from each other in a multi-layered printed circuit board.

The second conductive plate 20 may be any metal layer for transferring an electric signal in a printed circuit board. For example, the second conductive plate 20 can be any metal layer functioning as a power layer or a ground layer or any metal layer functioning as a signal layer constituting a signal line.

For example, when the second conductive plate 20 is a power layer, the first and third conductive plates 10 and 30 can be electrically connected to a ground layer. When the second conductive plate 20 is a ground layer, the first and third conductive plates 10 and 30 can be electrically connected to a power layer. Alternatively, when the second conductive plate 20 is a signal layer, the first and third conductive plates 10 and 30 can be electrically connected to a ground layer. When the second conductive plate 20 is a ground layer, the first and third conductive plates 10 and 30 can be electrically connected to a signal layer.

The electromagnetic bandgap structure may be adequately arranged in one line or two or more lines at any position where the conductive noise needs to be blocked.

Described below is the principle by which the structure shown in FIG. 2 can function as the electromagnetic bandgap structure blocking a signal of a certain frequency band.

The dielectric material 5 can be interposed between the first conductive plate 10 and the third conductive plate 30. This may cause a capacitance component to be formed between the second conductive plate 20 and the first and third conductive plates 10 and 30 and between the adjacent two conductive plates 10 and 30. Moreover, there can be an inductance component connecting through the via 91→the connection pattern 93→the via 92 between the adjacent two conductive plates 10 and 30 by the stitching via unit 90.

At this time, the value of the capacitance component can vary according to various factors such as the spaced distances between the second conductive plate 20 and the first and third conductive plates 10 and 30 and between the adjacent two conductive plates 10 and 30, the permittivity of the dielectric material 5 and the size, shape and area of conductive plate, etc.

The value of the inductance component can also vary according to various factors such as the shape, length, depth, width and area of the vias 91 and 92 and/or the connection pattern 93. Accordingly, adjusting and designing various aforementioned factors adequately can make it possible to allow the structure of FIGS. 2 and 3 to function as an electromagnetic bandgap structure (i.e. a band stop filter) for removing or blocking a certain noise or a certain signal of a target frequency band. This can be easily understood through the equivalent circuit of FIG. 4.

Figure 4:
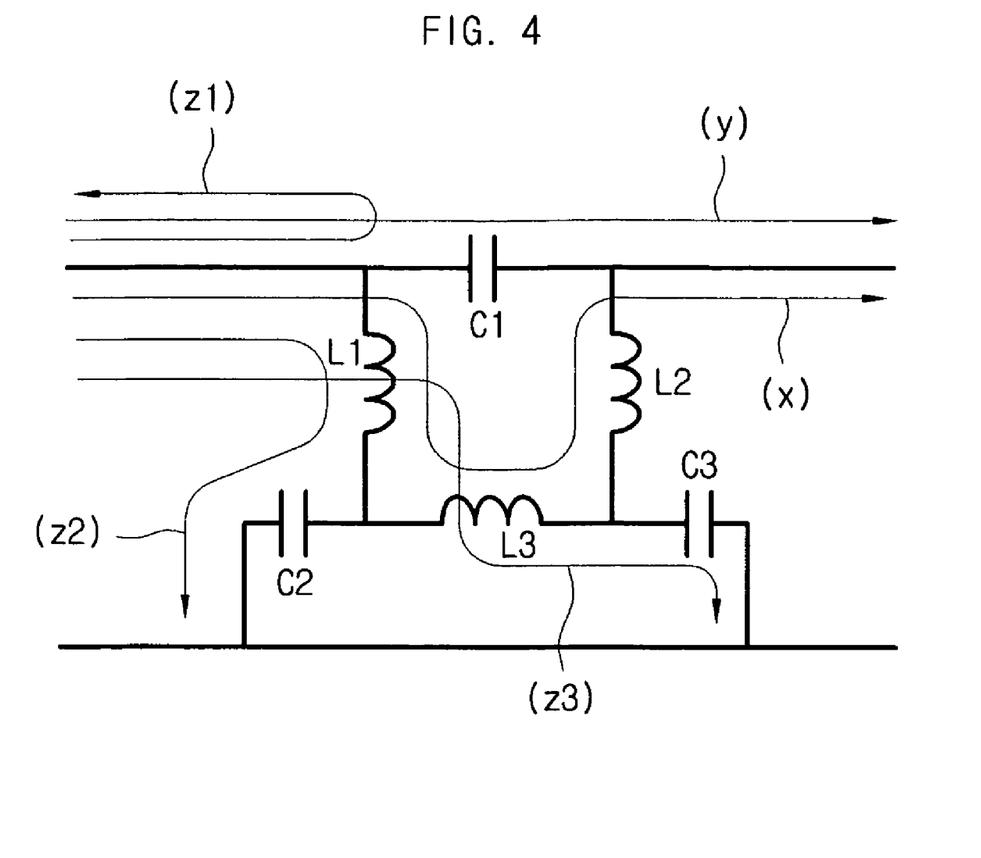
FIG. 4 shows an equivalent circuit of the electromagnetic bandgap structure of FIG. 3.

Comparing the equivalent circuit of FIG. 4 with the electromagnetic bandgap structure of FIG. 3, an inductance component L1 can correspond to the via 91 on the left side, and an inductance component L2 can correspond to the via 92 on the right side. An inductance component L3 can correspond to the connection pattern 93. C1 can be a capacitance component by the first and third conductive plates 10 and 30 and another dielectric material, which is to be placed above the first and third conductive plates 10 and 30, and the second conductive plate 20. C2 and C3 can be capacitance components by the second conductive plate 20, which is placed on the same planar surface as the connection pattern 93, and another dielectric material, which is to be placed below the planar surface of the connection pattern 93, and the second conductive plate 20.

As shown in the equivalent circuit of FIG. 4, the electromagnetic bandgap structure shown in FIGS. 2 and 3 can function as a band stop filter, which blocks a signal of a certain frequency band according to the above equivalent circuit.

In other words, as shown in FIG. 4, a signal x of a low frequency band (refer to FIG. 4) and a signal y of a high frequency band (refer to FIG. 4) can pass through the electromagnetic bandgap structure, and signals z1, z2 and z3 of certain frequency bands (refer to FIG. 4) ranging between the low frequency band and the high frequency band are blocked by the electromagnetic bandgap structure.

At this time, it should be noted that, since the electromagnetic bandgap structure shown in FIGS. 2 and 3 has a two-layered structure including the stitching unit 90, it is possible to have wider and more various bandgap frequency bands through a plurality of blocking paths z1, z2 and z3 (refer to FIG. 4) caused by 3 inductance components and 3 capacitance components.

Figure 5:
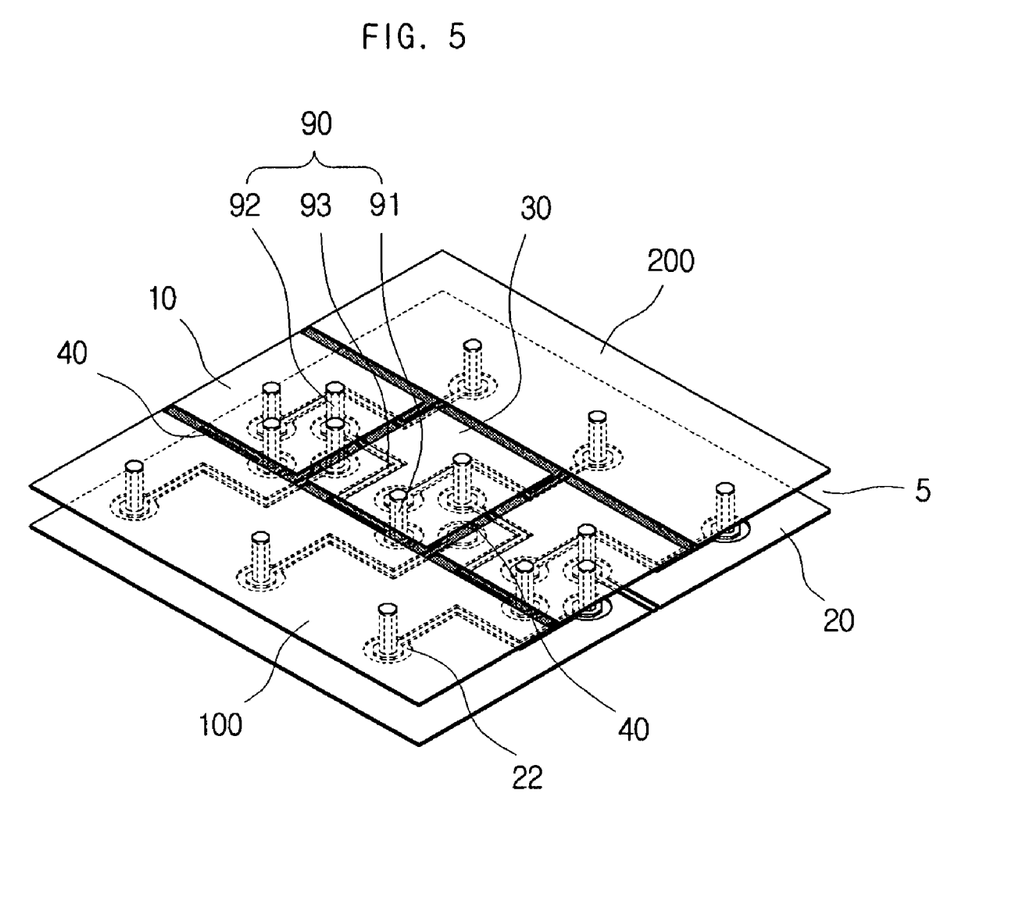
FIG. 5 is a perspective view showing a printed circuit board including an electromagnetic bandgap structure in accordance with an embodiment of the present invention.

Hereinafter, the structure of a printed circuit board into which the electromagnetic bandgap structure of the present embodiment is inserted will be described in more detail with reference to FIGS. 5 to 9. In the printed circuit board of the present invention, as shown in FIG. 5, the electromagnetic bandgap structure can be provided between two areas 100 and 200 where noises need to be blocked. At this time, an additional dielectric material 40 can be interposed between at least any two of the first, second, and third conductive plates 10, 20 and 30. The dielectric material 40 can have a permittivity that is different from that of the dielectric material 5 used for interlayer insulation in the printed circuit board.

In accordance with the present embodiment, since the capacitance value can be freely varied by interposing the dielectric material 40 having a different permittivity between the conductive plates 10, 20 and 30, it is possible to realize a stopband characteristic at a low frequency band without changing the size. Further, it is possible to obtain several stopband frequencies and widen the bandwidth of the blockable frequencies by interposing dielectric materials having various permittivities at various positions.

Especially, if the dielectric material 40 having a higher permittivity than that of the dielectric material 5 used for the interlayer insulation is interposed between the conductive plates 10, 20 and 30, it is possible to increase the capacitance value, thereby blocking the noises generated at a low frequency band. Accordingly, it can be expected that a noise level characteristic is more efficiently improved.

Figure 6:
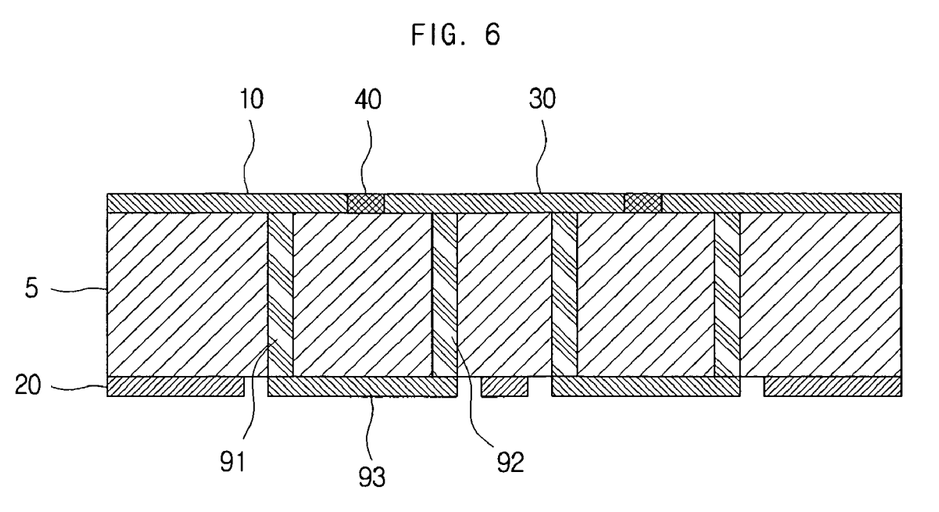
FIGS. 6 to 9 are cross sectional views showing printed circuit boards including electromagnetic bandgap structures in accordance with other embodiments of the present invention.
Figure 7:
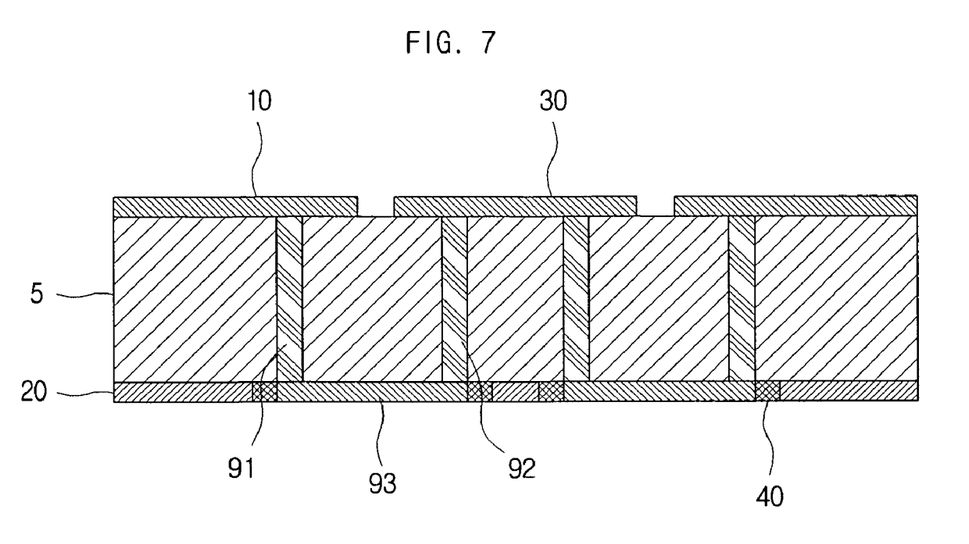
Figure 8:
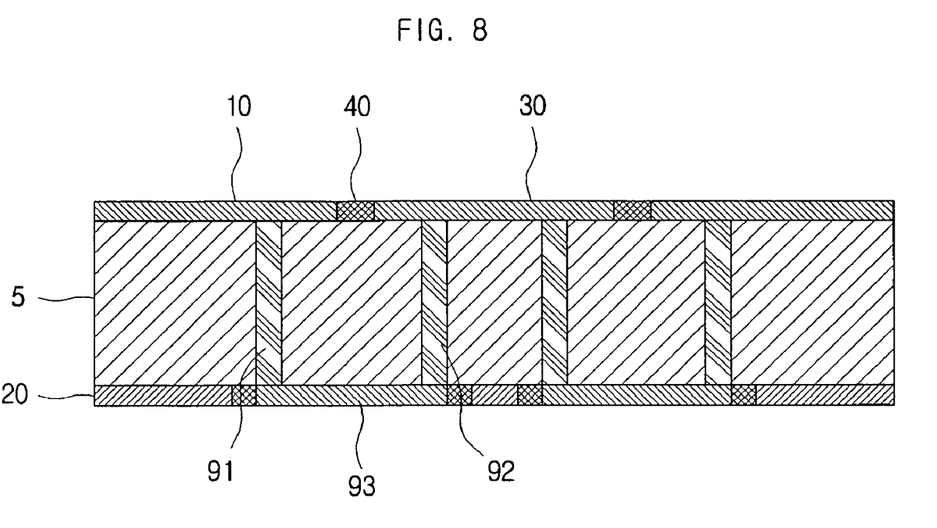
Figure 9:
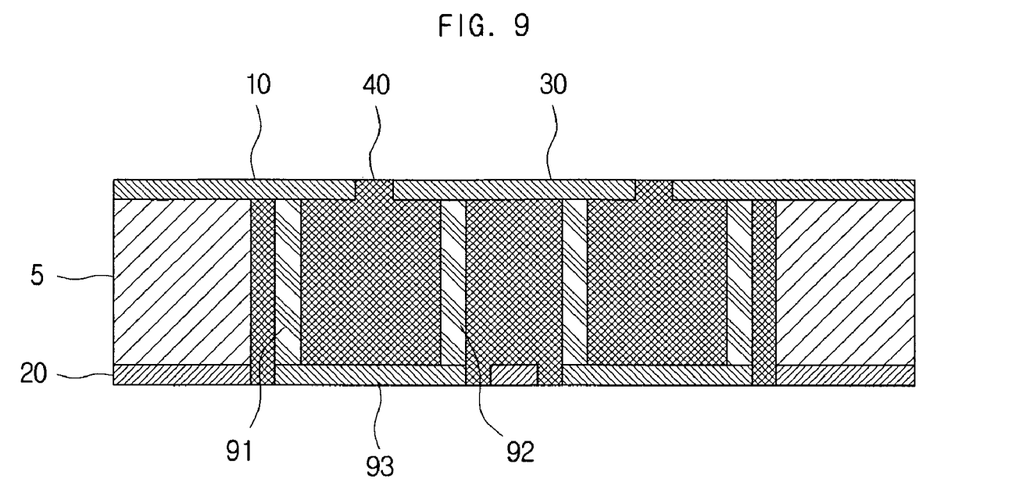

FIG. 6 shows that the dielectric material 40 is interposed between the first and third conductive plates 10 and 30 only, and FIG. 7 shows that the dielectric material 40 is interposed between the second conductive plate 20 and the connection pattern 93, i.e., in the clearance hole 22 (refer to FIG. 2). FIG. 8 shows that the dielectric material 40 is interposed between the first and third conductive plates 10 and 30 as well as in the clearance hole 22, and FIG. 9 shows that the dielectric material 40 is interposed between the first and third conductive plates 10 and 30, in the clearance hole 22, and between the first and second conductive plates 10 and 20, respectively.

Hitherto, although some embodiments of the present invention have been shown and described for the above-described objects, it will be appreciated by any person of ordinary skill in the art that a large number of modifications, permutations and additions are possible within the principles and spirit of the invention, the scope of which shall be defined by the appended claims and their equivalents.

Many other embodiments can be included in the scope of claims of the present invention.

What is claimed is:

1. A printed circuit board into which an electromagnetic bandgap structure is inserted, the electromagnetic bandgap structure including a first dielectric material for interlayer insulation and configured to block a noise, the electromagnetic bandgap structure comprising:
   a first conductive plate;
   a second conductive plate arranged on a planar surface that is different from that of the first conductive plate;
   a third conductive plate arranged on a same planar surface as the first conductive plate; and
   a stitching via unit configured to connect the first conductive plate and the third conductive plate through the planar surface on which the second conductive plate is arranged,
   wherein a second dielectric material is interposed between any two of the first conductive plate, the second conductive plate and the third conductive plate, the second dielectric material having a permittivity that is different from that of the first dielectric material.

2. The printed circuit board of claim 1, wherein the stitching via unit comprises:
   a connection pattern arranged on the same planar surface as the second conductive plate but electrically separated from the second conductive plate; and
   a pair of vias connecting opposite ends of the connection pattern to the first conductive plate and the third conductive plate, respectively.

3. The printed circuit board of claim 2, wherein the second dielectric material is interposed between the second conductive plate and the connection pattern.

4. The printed circuit board of claim 1, wherein the second dielectric material has a higher permittivity than that of the first conductive plate.

* * * * *